(12) United States Patent
Antonell et al.

(10) Patent No.: US 6,534,851 B1
(45) Date of Patent: Mar. 18, 2003

(54) MODULAR SEMICONDUCTOR SUBSTRATES

(75) Inventors: Michael Antonell, Orlando, FL (US); Erik Cho Houge, Orlando, FL (US); Nitin Patel, Orlando, FL (US); Larry E. Plew, St. Cloud, FL (US); Catherine Vartuli, Windermere, FL (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/642,376

(22) Filed: Aug. 21, 2000

(51) Int. Cl.$^7$ ................................ H01L 23/06
(52) U.S. Cl. .............. 257/684; 257/723; 257/724; 257/707
(58) Field of Search .................. 257/684, 777, 257/723, 729, 732, 711, 707, 724, 730, 685; 361/769

(56) References Cited

U.S. PATENT DOCUMENTS

| | | | | |
|---|---|---|---|---|
| 5,391,917 A | * | 2/1995 | Gilmour et al. ............ 257/690 |
| 5,473,192 A | * | 12/1995 | Golubic et al. ............ 257/684 |
| 5,495,395 A | * | 2/1996 | Yoneda et al. ............ 257/777 |
| 5,798,564 A | * | 8/1998 | Eng et al. .................. 257/686 |
| 5,849,608 A | * | 12/1998 | Abe ........................... 257/676 |
| 6,096,574 A | * | 8/2000 | Smith ........................ 438/106 |

* cited by examiner

Primary Examiner—David Nelms
Assistant Examiner—Andy Huynh
(74) Attorney, Agent, or Firm—Christie, Parker & Hale, LLP (57) ABSTRACT

A modular substrate-based processing scheme for producing semiconductor devices provides multiple modular processing units which may be arranged together to form any of various cohesive processing units or they may be individually or sequentially processed through standard semiconductor processing equipment. The cohesive processing units are processed unitarily providing for multiple modular processing units to be processed simultaneously. The modular processing units may be formed of a thick semiconductor substrate or a semiconductor substrate mounted on a further substrate such as a ceramic material. The modular processing units may each contain ribs, grooves, posts or other features to aid in handling and placement of the individual units.

27 Claims, 7 Drawing Sheets

MODULAR SEMICONDUCTOR SUBSTRATES

TECHNICAL FIELD

The present invention relates most generally to semiconductor devices and methods for forming the same. More particularly, the present invention is directed to the substrates upon which semiconductor devices are formed, and methods for manufacturing semiconductor devices.

BACKGROUND OF THE INVENTION

The semiconductor manufacturing industry is a wafer-based manufacturing industry. That is, the substrates upon which semiconductor devices are formed, are most commonly substrates formed of semiconductor materials and which are generally flat and round and have a multiplicity of square or rectangular-shaped semiconductor devices formed thereon. These substrates, typically referred to as wafers, may include dozens, hundreds or even thousands of individual semiconductor devices which are also known as chips. In today's semiconductor manufacturing industry, the trend is towards the use of increasingly larger wafers, typically silicon wafers. The use of larger substrates allows more devices to be simultaneously formed on the substrates. However, the wafer-based manufacturing model includes several shortcomings which are exacerbated by the increasingly larger wafer sizes.

An example of such a shortcoming is wafer cost. Silicon wafers are formed from monocrystalline silicon ingots having diameters at least as large as the desired silicon wafer. The silicon wafers are formed by slicing the hardened, crystalline ingot. As such, it can be seen that as wafer size increases, cost increases. In fact, because useful portions of the ingot must be single crystal and defect-free, costs increase exponentially with diameter.

Wafers which are typically used as substrates are essentially single crystal pieces of silicon aligned with the normal direction of the wafer surface equal to the <100> direction of the crystalline lattice and the transverse and rolling directions equal to the <010> and <001> directions. Single crystal ingots extremely hard to grow to larger sizes and the movement to larger sized wafer diameters increases the cost of the wafers tremendously. Moreover, there are additional problems associated with the uniformity of the wafers, and strains within the lattice present another problem which becomes more and more prevalent as the size of the wafer increases. A wafer with a strained lattice is susceptible to breaking.

Another shortcoming associated with conventional wafer manufacturing, and intensified by the use of increasingly larger wafers, is the new tooling cost associated with fabricating semiconductor devices on each next-generation, larger diameter wafer substrates. New equipment must be purchased or existing equipment retrofitted to accommodate handling and processing the wafers when the next wave of larger wafers is introduced. In many cases, processing equipment which is being used within a semiconductor fabrication facility is not capable of being retrofitted to accommodate wafers which exceed a certain size. For example, a processing tool originally designed to accommodate 6" diameter silicon wafers, and which has successfully been retrofitted to accommodate 8" diameter silicon wafers, may not be capable of being further retrofitted to accommodate 10 or 12 inch diameter silicon wafers, because of limitations of the system hardware. Such a tool therefore becomes obsolete, and a replacement tool capable of accommodating 12" wafers, must be purchased anew.

Another shortcoming associated with the use of increasingly larger substrates is the average cost necessary to produce a functional device. If a substrate, commonly a silicon wafer, is mishandled and becomes damaged, for example if it breaks, the entire wafer must be scrapped because a damaged wafer cannot be handled using processing equipment configured only for handling a standard sized undamaged wafer. Furthermore, once a wafer is cracked or chipped, it is prone to further fracturing or shattering at elevated temperatures. Once a wafer fractures or shatters, wafer fragments from the broken substrate may contaminate several other wafers, causing them to be scrapped also. Therefore, once a wafer is chipped, the entire wafer must be scrapped. As such, when a wafer is scrapped, many good devices or potentially good devices are also scrapped. When a wafer is scrapped, dozens, hundreds, or even thousands of individual semiconductor devices may be scrapped depending on the size of the substrate and the semiconductor devices.

During the semiconductor manufacturing process, several in-line monitoring techniques are carried out to assure that the physical dimensions and measurable parameters of various device features, are within the acceptable, or specified, limits. The monitoring techniques may be carried out using an active (or, "production") device or they may be carried out upon a specially included test monitor which may be included among hundreds of active devices on a wafer. At any rate, the entire wafer must be removed from the manufacturing sequence and introduced to the analytical equipment. From a yield perspective, in-line monitoring (metrology, for example) exposes all of the chips on a wafer to the diagnostic technique thereby increasing the number of steps in the process flow through which the wafer must be processed. As the number of steps in the process flow increases, production costs increase, and the likelihood of wafer contamination or other defects, also increases.

Much of the analytical and diagnostic monitoring carried out during the fabrication sequence, occurs either outside of the manufacturing, or fabrication area or requires the destruction of the entire wafer, or both. When a wafer is removed from the controlled, "clean room" environment of the fabrication area to be analyzed at various points in the manufacturing process, it is exposed to the foreign contamination of the outside environment, and the entire wafer must be scrapped. This is true even though only a single active device or test chip is being monitored on the wafer which contains hundreds of active devices. In this manner, many potentially functional devices are lost. Many of the techniques used for analytical monitoring, such as secondary ion mass spectrometry, focused ion beam spectroscopy, Auger electron spectroscopy and other SEM (scanning electron microscopic) techniques, require the wafer to be cleaved so that a small part of the wafer can be mounted within the analytical tool. As such, the entire wafer must be scrapped. It can be understood that, with increasing wafer size, a greater number of potentially good devices are sacrificed in order to carry out in-line monitoring and analytical techniques.

Moreover, the number of wafers sampled to monitor a particular processing operation is increased when a wafer-by-wafer processing operation is used. Multiple wafers must be analyzed to understand process variations from the beginning to the end of a "run". This compounds the number of potentially good devices which must be sacrificed for analytical purposes.

It can be seen that there is a need to reduce the costs associated with using increasingly large semiconductor substrates, while still processing a maximum number of chips through the various processing operations and producing a maximum number of functional devices.

SUMMARY OF THE INVENTION

The present invention provides a modular substrate-based manufacturing model for the semiconductor manufacturing industry and represents a move away from the wafer-based model and the trend towards wafers of increasingly larger size. More specifically, the present invention provides multiple modular semiconductor processing units which can be individually or sequentially processed in state-of-the-art semiconductor processing equipment, to produce devices having sub-micron features at the leading edge of technology. The individual modular semiconductor processing units are sized to be much smaller than the conventional, commonly used substrates known as wafers. The present invention provides modular processing units, each containing at least one die or semiconductor device. The modular semiconductor processing units may be formed of simply a single, thick semiconductor substrate material, or they may be formed of a semiconductor substrate material individually mounted on a base substrate to aid in handling and processing the modular processing units as individual pieces through various semiconductor processing tools.

The individual modular semiconductor processing units may also be arranged together in various configurations to form cohesive processing units, each of which may be processed as a unit through various standard semiconductor processing tools. In this manner, multiple modular semiconductor processing units may be processed simultaneously through the various, standard pieces of semiconductor processing equipment which may be configured to process cohesive processing units of different configurations and sizes. These cohesive processing units formed of multiple modular semiconductor processing units which are grouped together, are adapted to be processed through state-of-the-art semiconductor processing equipment, capable of producing semiconductor devices having sub-micron features. The cohesive processing units may additionally include test monitors within the group.

An aspect of the present invention is that highly integrated and advanced semiconductor devices may be formed on the modular semiconductor processing units, whether the modular semiconductor processing units are processed individually or simultaneously as part of a cohesive processing unit.

The present invention also provides a method for forming semiconductor devices by processing individual modular semiconductor processing units through various processing operations, while also providing for processing a cohesive processing unit formed of a group of individual modular semiconductor processing units, through various other processing operations, depending on the operation and the equipment used to perform the operation. The cohesive processing unit of individual modular semiconductor processing units may be arranged in accordance with the particular processing tool used to perform the particular operation. Test monitors may be added at various stages, and they may be removed after the conclusion of the particular operation, enabling the bulk of the group of individual modular semiconductor processing units to be processed on without delay. After the modular processing units are processed through a first processing operation, they may be arranged and processed as a group forming a cohesive processing unit, through another piece of semiconductor processing equipment adapted to process such a cohesive processing unit.

BRIEF DESCRIPTION OF THE DRAWING

The invention is best understood from the following detailed description when read in connection with the accompanying drawing. It is emphasized that, according to common practice, the various features of the drawing are not to-scale. On the contrary, the dimensions of the various features are arbitrarily expanded or reduced for clarity. Included in the drawing are the following figures.

DETAILED DESCRIPTION OF THE INVENTION

The present invention provides individual modular semiconductor substrate units (referred to as modular semiconductor processing units) which can be individually processed through state-of-the-art semiconductor processing equipment (alternatively referred to as tools), or arranged together to form a cohesive processing unit which may be unitarily processed using standard semiconductor processing equipment such as is available in the art. In an exemplary embodiment, the individual modular semiconductor processing units may be arranged in a fixed, two-dimensional array to form the cohesive processing unit. In another exemplary embodiment, the individual modular semiconductor processing units may be arranged in a three-dimensional configuration.

The individual modular semiconductor processing units may be formed entirely of silicon or another semiconductor material such as GaAs, or other type 4 or group III–V semiconductor material according to one exemplary embodiment. According to another exemplary embodiment, the individual modular semiconductor processing units may be formed of a silicon, GaAs or other semiconductor material mounted over a further substrate material such as a ceramic, glass, teflon, quartz or another semiconductor material. The modular semiconductor processing units may be generally square, generally rectangular, generally circular, or they may form a parallelogram or take on any of various other shapes.

The modular semiconductor processing unit may additionally include grooves, ribs, posts, flanges or other means by which the modular semiconductor processing units may be grasped and secured to a holder which retains a group of modular semiconductor processing units arranged together to form a cohesive processing unit. According to another exemplary embodiment in which such a holder is not used, the grooves, ribs, posts and flanges may provide for the modular semiconductor processing unit to be secured within the processing tool directly and processed.

The dimensions of the individual modular substrate units, or modular semiconductor processing units, may vary, but in each case the modular semiconductor processing unit will be adapted for having at least one semiconductor device, such as an integrated circuit, formed on its upper semiconductor surface. The area of a substrate onto which an individual semiconductor device will be formed, is called a die. An individual semiconductor device may also be referred to as a chip. According to various exemplary embodiments, the individual modular semiconductor processing unit may be shaped and sized to include a single die, an array of several die arranged in rows and columns, or multiple die arranged in other configurations. In an exemplary embodiment, the lateral dimensions of the individual modular semiconductor processing units may include a diameter of 3 inches or less. In an exemplary embodiment, the modular semiconductor processing units may be generally rectangular and may include a 2×3 array of die, with each die having a length of 0.8 inches and a width of 1.0 inches. According to another exemplary embodiment, the modular semiconductor processing units each may be a 2"×2" unit including a 3×3 array of die. According to another exemplary embodiment in which each die is a memory chip having an area of 5 mm$^2$, a 9×9 die array may be formed on a modular semiconductor processing unit having dimensions of 2.5 cm×2.5 cm.

Figure 1:
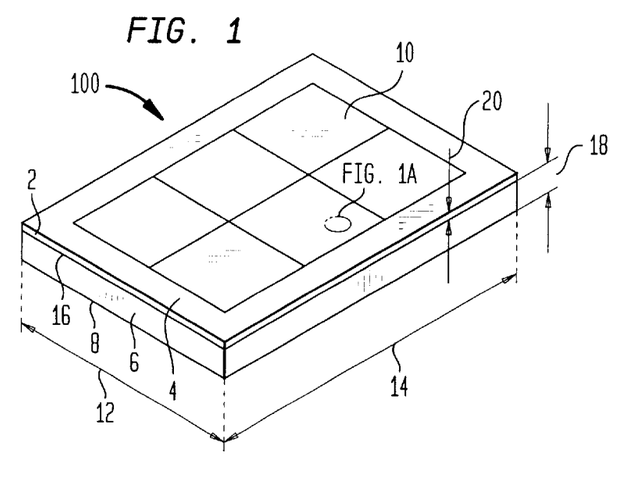
FIG. 1 is a perspective view of an exemplary embodiment of a modular semiconductor processing unit.

Now turning to the drawing, FIG. 1 is a perspective view showing a first embodiment of a modular semiconductor processing unit of the present invention. It is to be emphasized at this point that the embodiments of the modular semiconductor processing units shown and described are intended to be exemplary and not restrictive of the present invention.

Modular semiconductor processing unit 100 includes semiconductor substrate 2 mounted over base substrate 6. It can be seen that each of semiconductor substrate 2 and base substrate 6 have the same lateral dimensions. Semiconductor substrate 2 includes surface 4 upon which the semiconductor devices will be, or are, formed. Each die 10 represents a portion of surface 4 in which a single semiconductor device may be formed. The semiconductor device may be an active device such as an integrated circuit or it may be a test chip. The size of the individual die 10 is determined by the nature of the semiconductor device and the level of integration of the device. Die 10 may include any of various semiconductor devices. It can be seen that modular semiconductor processing unit 100 includes an array of 2×3 die 10. This is intended to be exemplary only, and various other arrays of dice 10 may be used alternatively. The configuration used will depend, in part, upon the size of the individual die 10, and the overall size of modular semiconductor processing unit 100. Modular semiconductor processing unit 100 is seen to be a parallelogram or generally rectangular in shape.

Modular processing unit 100 includes width 12 and length 14. Each of length 14 and width 12 may be 3 inches and less. Semiconductor substrate 2 includes thickness 20 which may range from 5 $\mu$m to 700 $\mu$m according to various exemplary embodiments. Thickness 20 of semiconductor substrate 2 may be chosen in conjunction with thickness 18 of base substrate 6 which may range from 500–1000 $\mu$m in various exemplary embodiments. In an exemplary embodiment, the total of thicknesses 20 and 18 may be within the range of 500–1500 $\mu$m, but other total thicknesses may be used alternatively. Base substrate 6 may be formed of a semiconductor material such as silicon, or it may be formed of teflon, glass, quartz, or other ceramic materials. Semiconductor substrate 2 is mounted on base substrate 6 by means of an adhesive included along interface 16 between semiconductor substrate 2 and base substrate 6. Any suitable adhesive which is not prone to outgassing, may be used. The adhesive may be a conventional material chosen for ease of removal after device fabrication is complete. According to an exemplary embodiment, an epoxy material may be used. Modular semiconductor processing unit 100 includes underside 8.

Modular semiconductor processing unit 100 is adapted to be individually processed within state-of-the-art semiconductor processing equipment. The individual modular semiconductor processing unit 100 is adapted for being loaded and processed through various semiconductor processing operations carried out in various standard semiconductor processing tools such as etch reactors, chemical mechanical polishing tools, sputter deposition reactors, chemical vapor deposition reactors, plasma vapor deposition reactors, coating equipment, evaporation tools, ion implantation tools, diffusion furnaces, cleaning equipment, automated and manual wet processing tools, and patterning equipment. The preceding list is intended to be exemplary and not restrictive of the various processing tools used for semiconductor processing and within which the modular processing units 100 of the present invention may be processed. In an alternative embodiment as will be shown in FIG. 2, the individual modular processing unit may be formed of a single thick semiconductor substrate which is also capable of being processed through the various processing tools individually.

In addition to being capable of being processed individually through the various semiconductor processing tools, a group of modular semiconductor processing units such as modular semiconductor processing unit 100 shown in FIG. 1 may also be processed sequentially as a group through the various semiconductor processing tools. Another aspect of the present invention is that a group of individual modular semiconductor processing units 100 of the present invention, may be arranged to form a cohesive processing unit which includes multiple processing units 100 configured in any of various shapes, and is adapted for being processed unitarily through any of the various semiconductor processing tools listed previously. The cohesive processing unit formed of multiple individual modular semiconductor processing units 100 may include the individual units 100 arranged in a plane to form a fixed, two-dimensional array or they may be arranged in a three-dimensional configuration.

It is to be further understood that an aspect of the present invention is that the modular semiconductor processing units 100 are adapted to be processed both individually and collectively as a group through state-of-the-art equipment which, in turn, is adapted to receive and process individual modular semiconductor processing units 100 or the modular semiconductor processing units 100 arranged together to form a group which forms a cohesive processing unit. The state-of-the-art equipment is capable of producing highly integrated, sub-micron device features.

Figure 1A:
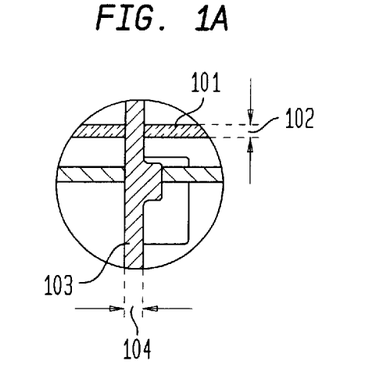
FIG. 1A is a plan view showing a section of an individual die.

FIG. 1A shows an expanded view of a section of an active device formed on die 10 of modular processing unit 100. FIG. 1A is a plan view showing various device features such as conductive line 103 and lead line 101 which may be formed of a semiconductor material. By highly integrated, sub-micron device features, it is meant that width 102 of lead line 101 and width 104 of conductive line 103 may each be within the sub-micron regime. In an exemplary embodiment, each of width 102 and width 104 may be 0.2 microns or less. It is to be understood that such dimensions of device features are exemplary only and that the various device features will be based on integration level, device application, and the specific processing tools used to form the device. As device integration increases, the lateral dimensions of device features will, of course, be reduced accordingly. It is to be emphasized at this point that the present invention provides highly integrated sub-micron devices having lateral dimensions in the sub-micron regime which are formed in relatively small groups of die included on modular semiconductor substrate units 100 which include lateral dimensions such as width 12 and length 14 shown in FIG. 1, which may range from 1 to 3 inches according to various exemplary embodiments. Other device features, such as film thicknesses and uniformities, also reflect the state-of-the-art capabilities of the processing tools used.

The present invention is therefore distinguished from the previous wafer-based manufacturing model in that the preferred modular semiconductor processing unit 100 is seen to be generally rectangular in shape, to include sub-micron features and to have a smaller diameter, for example less than or equal to 3 inches. This is to be distinguished from the wafer-based processing model of years past when wafer sizes were in the 3 to 4 inch range. At that time, the semiconductor processing tools capable of handling and processing 3–4 inch wafers were of a correspondingly lower technology and incapable of reliably producing sub-micron features or other device aspects such as film thicknesses, which are now achievable using the present state-of-the-art equipment. Furthermore, conventional processing tools are limited to handling and processing standard, circular substrates. An aspect of the present invention is therefore the production of highly integrated semiconductor devices formed using state-of-the-art technology and including sub-micron features, on a modular-based processing model including individual modular processing units having lateral dimensions on the order of 1 to 3 inches and not limited to the circular shape used in conventional wafer-based processing models.

According to a first exemplary embodiment, die 10 may include an active device which includes a test structure. In an alternative embodiment, each die 10 may be a test chip instead of an active semiconductor device. In yet another alternative embodiment, modular semiconductor processing unit 100 may include active semiconductor devices on some die 10 and test chips on other die 10. In the exemplary embodiments wherein modular processing unit 100 includes at least one test chip, modular processing unit 100 is referred to as a test monitor. Such a test monitor may be processed along sequentially or as part of a cohesive processing unit with other modular processing units 100 which include only active semiconductor devices. In an exemplary embodiment, each of the modular processing units 100 and test monitors will be substantially the same shape and size, and therefore capable of being processed along with the modular semiconductor processing units 100 which include only active semiconductor devices.

Figure 2:
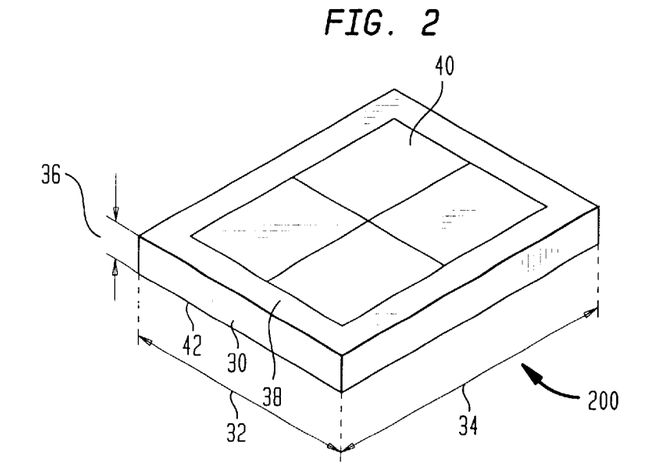
FIG. 2 is a perspective view of another exemplary embodiment of a modular semiconductor processing unit.

Now turning to FIG. 2, a second exemplary embodiment of a modular semiconductor processing unit 200 is shown. In this exemplary embodiment, it can be seen that an array of four die 40, arranged in a 2×2 array are formed on surface 38 of thick semiconductor substrate 30. In this exemplary embodiment, the modular semiconductor processing unit is not formed of a thin semiconductor substrate formed over a base substrate: rather, a single thick semiconductor substrate 30 is used. In an exemplary embodiment, thick semiconductor substrate 30 may include a thickness 36 of greater than 700 μm but other thicknesses greater than 500 μm may be used alternatively. In the exemplary embodiment shown in FIG. 2, modular processing unit 200 is essentially square, with width 32 being equal to length 34 of modular semiconductor processing unit 200. In an exemplary embodiment, modular semiconductor processing unit 200 may include dimensions of 1.5"×1.5", but other dimensions may be used in alternative embodiments, depending, in part, upon the number and size of die 40 which are formed on surface 38.

As with the first exemplary embodiment of a modular semiconductor processing unit as shown in FIG. 1, the modular semiconductor processing unit 200 shown in FIG. 2 may be individually, or sequentially processed through the various semiconductor processing tools listed in conjunction with modular semiconductor processing unit 100 as in FIG. 1. Furthermore, a plurality of modular semiconductor processing units 200 may also be arranged to form a cohesive processing unit which may processed unitarily through any of the various types of tools used in the semiconductor processing industry. In this manner, the modular semiconductor processing units are processed simultaneously. Also as discussed in conjunction with FIG. 1, die 40 may represent an active semiconductor device or it may represent a test chip. A test monitor including at least one test chip, may be individually processed along with modular semiconductor processing units which include only active semiconductor devices, or it may be included within the group of modular semiconductor processing units arranged to form a cohesive processing unit for being simultaneously processed through a particular semiconductor processing operation.

Figure 3:
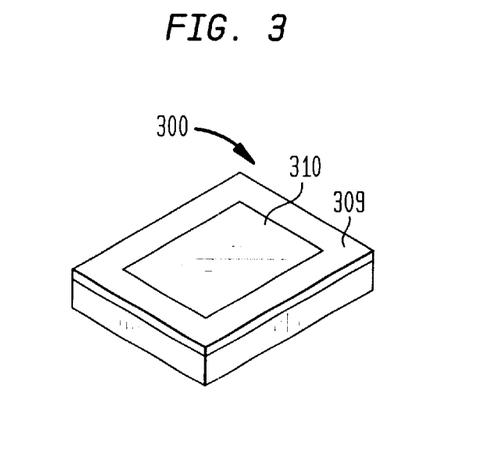
FIG. 3 is a perspective view of yet another exemplary embodiment of a modular semiconductor processing unit.

FIG. 3 shows another exemplary embodiment of modular semiconductor processing unit 300. Modular semiconductor processing unit 300 is an embodiment which includes only a single die 310 formed on semiconductor surface 309.

Figure 4:
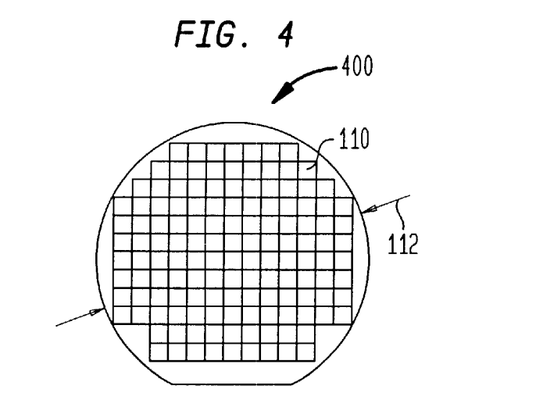
FIG. 4 is a plan view of another exemplary embodiment of a modular semiconductor processing unit.

FIG. 4 shows another exemplary embodiment of modular semiconductor processing unit 400. The die 110 and modular semiconductor processing unit 400 include the same characteristics discussed in conjunction with the other exemplary embodiments shown in FIG. 1 and FIG. 2. As such, modular semiconductor processing unit 400 may include a thick singular semiconductor substrate as in FIG. 2 or it may be formed of a thinner semiconductor substrate formed over a base substrate as in FIG. 1. While modular processing unit 400 shown in FIG. 3 is substantially circular in size and similar to a conventional wafer in its shape, diameter 112 of modular semiconductor processing unit 400 will be 3 inches or less and devices formed on modular semiconductor processing unit 400 will include sub-micron device features and other device aspects only achievable using state-of-the-art processing equipment.

Modular semiconductor processing units 100, 200, 300 and 400 are capable of being processed individually, sequentially, or grouped together to form a cohesive processing unit, through the various semiconductor processing tools referred to previously.

Regardless of the precise configuration of the modular semiconductor processing unit, the modular semiconductor processing unit may include alignment or handling features which enable the individual modular processing unit to be loaded and processed through various semiconductor processing tools, either individually, sequentially, or grouped together. Conventionally available robotics may be used to grasp, transport and load the individual units into processing tools or onto a holder capable of receiving the individual units, such as will be shown in FIG. 7. When grouped together to form a cohesive processing unit capable of being unitarily processed through semiconductor processing equipment, alignment or handling features may be used to load and secure the modular processing units into position.

Figure 5:
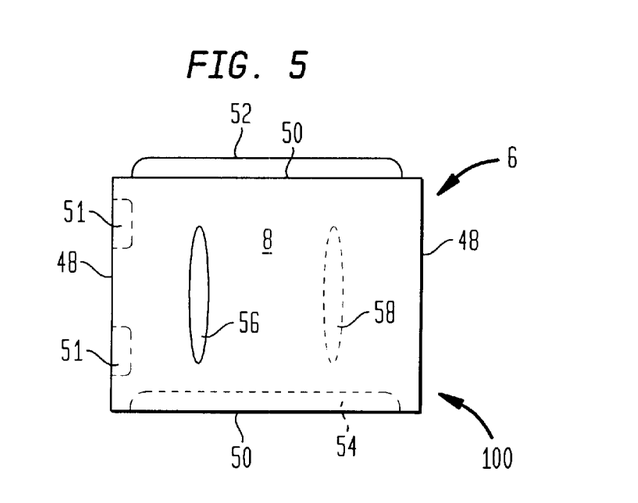
FIG. 5 is a plan view showing the underside of an exemplary modular semiconductor processing unit.

FIG. 5 shows various examples of the handling/positioning features which enable the individual modular semiconductor processing units to be handled using state-of-the-art robotics as available in the art. FIG. 5 is a plan view showing the underside 8 of the modular semiconductor processing unit 100 shown in FIG. 1. It should be understood that such use is intended to be exemplary only. The handling/positioning features shown in conjunction with modular semiconductor processing unit 100 as shown in FIG. 1, may equally be formed on any of various other configurations of modular processing units which may be used. On underside 8 of modular semiconductor processing unit 100, groove 58 and raised rib 56 are shown. Opposed sides 50 each include a handling/positioning feature. Groove 54 extends in from bottom side 50 of modular processing unit 100, while rib 52 extends outward from upper side 50 of modular processing unit 100. On the left hand side of the embodiment shown in FIG. 5, side 48 includes two grooves 51 which extend inward.

The grooves, ribs, and other exemplary embodiments of handling/positioning features which are not shown, may be used in positioning a group of modular processing units in close proximity to one another, or they may be used by robotics to mechanically grasp, transport and position the individual modular semiconductor processing units. The ribs, grooves, or other handling/positioning features may also be used in positioning and securing the individual modular processing units within a holder within which a group of modular processing units may be grouped together to form a cohesive processing unit which may be unitarily processed within various pieces of semiconductor processing equipment. According to another exemplary embodiment, the ribs, grooves or other handling/positioning features may be used to position the individual modular processing units within processing tools. According to yet another exemplary embodiment, the ribs, grooves or other handling/positioning features may not be needed as vacuum chucks or other means may be used to grasp and position the modular processing units.

Examples of various alternative handling/positioning features are shown on the exemplary embodiments of the modular semiconductor processing units shown in FIGS. 6A–6F. Each of FIGS. 6A–6F are perspective views.

Figure 6A:
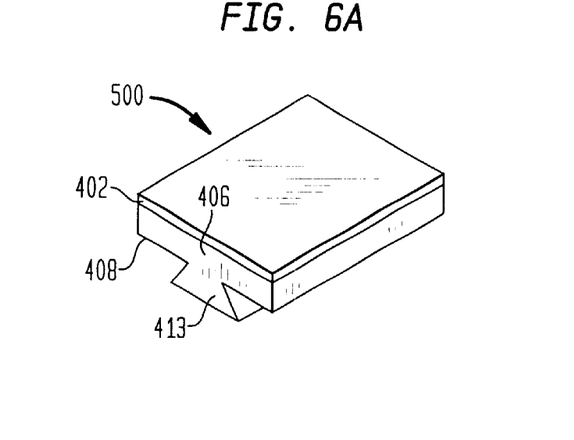
FIGS. 6A, 6B, 6C, 6D, 6E and 6F are each perspective views showing further exemplary embodiments of modular semiconductor processing units each containing handling/positioning features.

In the exemplary embodiment shown in FIG. 6A, modular semiconductor processing unit 500 is formed of semiconductor substrate 402 mounted on base substrate 406. From beneath underside 408 extends dovetail rib 413. Dovetail rib 413 serves as a handling/positioning feature.

Figure 6B:
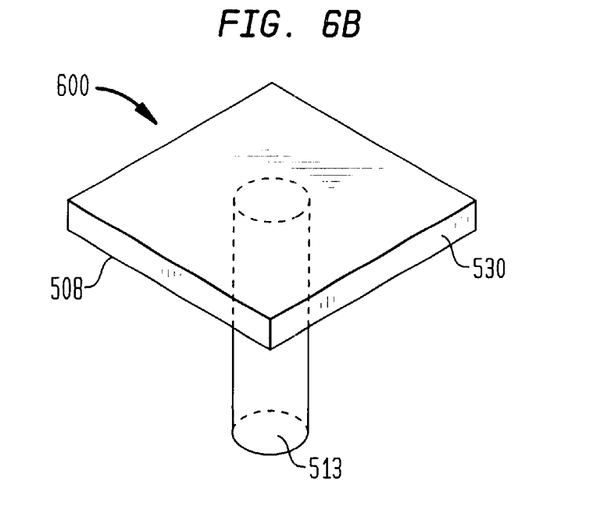

Turning now to the exemplary embodiment shown in FIG. 6B, modular semiconductor processing unit 600 is formed of a single thick semiconductor substrate 530 which includes post 513 serving as a handling/positioning feature extending down from underside 508.

Figure 6C:
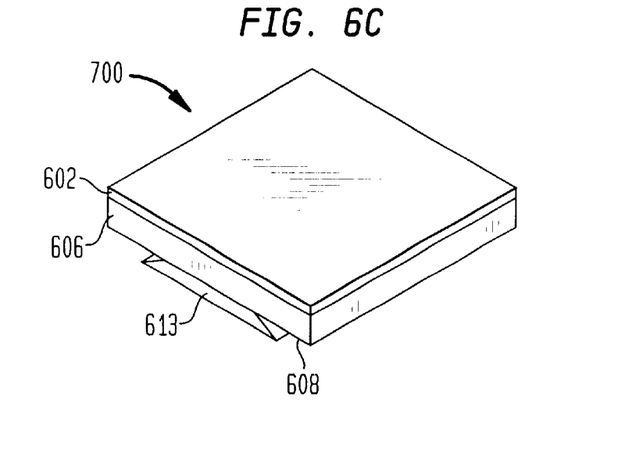

In the exemplary embodiment shown in shown in FIG. 6C, modular semiconductor processing unit 700 is formed of semiconductor substrate 602 mounted on base substrate 606. Beneath underside 608 of modular semiconductor processing unit 700, a partial-dovetail handling/positioning feature 613 is formed.

Figure 6D:
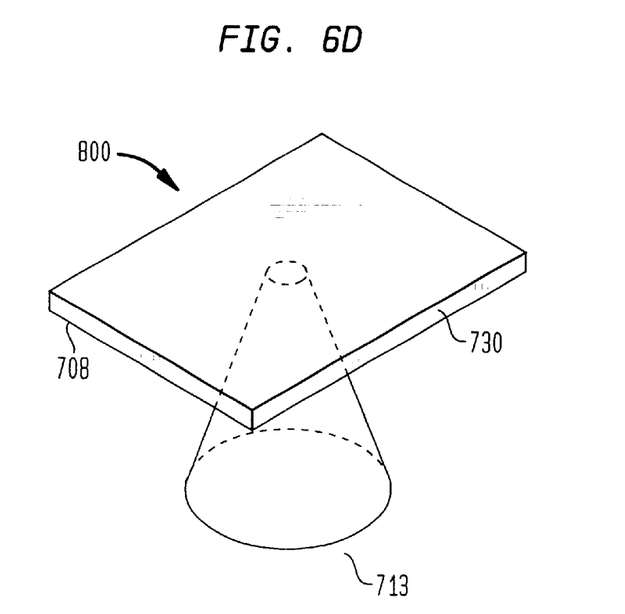

FIG. 6D shows another exemplary embodiment of a modular semiconductor processing unit 800 formed of a single thick semiconductor substrate 730 which includes conical post 713 extending down from underside 708 to form a handling/positioning feature.

Figure 6E:
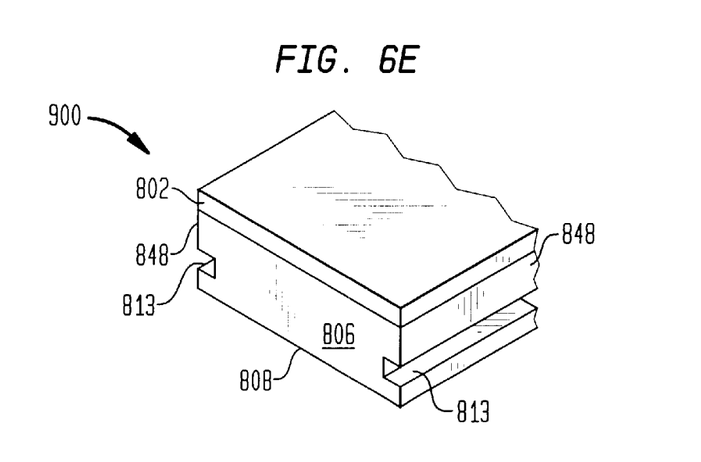

In the exemplary embodiment of modular semiconductor processing unit 900 shown in FIG. 6E, semiconductor substrate 802 and base substrate 806 combine to form modular semiconductor processing unit 900. Modular semiconductor processing unit 900 includes grooves 813 formed on each of opposed sides 848 of base substrate 806. Grooves 813 serve as handling/positioning features, as discussed above.

Figure 6F:
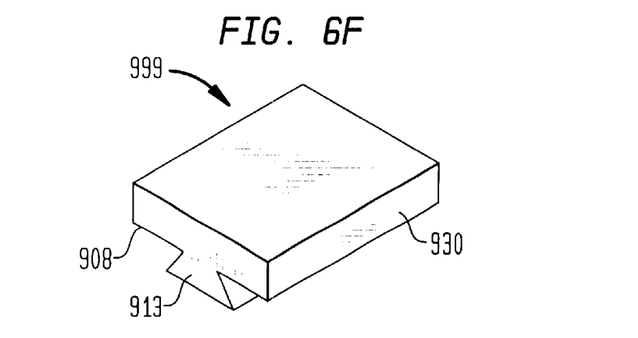

FIG. 6F shows an exemplary embodiment of a modular semiconductor processing unit 999 formed of a single thick semiconductor substrate 930 which includes dovetail rib 913 extending from underside 908 to serve as a handling/positioning feature.

It is to be understood that the examples of the handling/positioning features shown in the foregoing figures are intended to be just that - examples. Various other handling/positioning features may be used to aid in grasping and handling by robotics, positioning the units next to one another, and for attaching the modular semiconductor processing units to holders when they are grouped together to form cohesive processing units.

Figure 7:
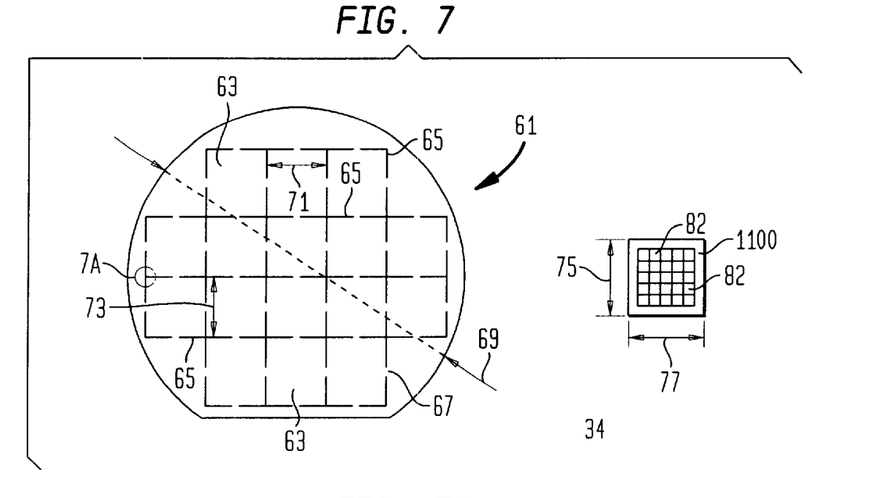
FIG. 7 is a plan view of a first exemplary embodiment of a holder for holding a group of individual modular semiconductor processing units, and also showing an individual modular semiconductor processing unit.
Figure 7A:
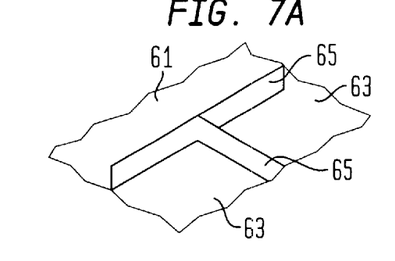
FIG. 7A is an expanded perspective view showing the ribs of the holder shown in FIG. 7.

A first exemplary embodiment of such a holder is shown in FIG. 7. FIG. 7 is a plan view showing holder 61 which is capable of releasably securing a number of modular semiconductor processing units, each modular semiconductor processing unit secured within a corresponding compartment 63 of holder 61. Raised ribs 65 which are shown more clearly in the expanded view shown in FIG. 7A, form the boundaries of the individual compartments 63 within which an individual modular semiconductor processing unit may be secured. Length 73 and width 71 of individual compartments 63 are chosen to accommodate the particular size of the modular semiconductor processing unit being used. It should be further understood that within one or several of compartments 63, a test monitor may be placed during the processing operation.

Diameter 69 of holder 61 may vary according to the semiconductor processing tool within which holder 61 will be processed. It can be seen that holder 61 as shown in FIG. 7 is substantially similar in shape to a standard semiconductor wafer. This is intended to be exemplary only. Various features such as notches 67 may be used for easy positioning and unloading of the individual modular semiconductor processing units within the compartments 63 of holder 61. In the particular embodiment shown in FIG. 7, each compartment 63 is sized and shaped in order to receive modular semiconductor processing unit 1100 which has dimensions 75 and 77 and which includes an array of die 82 formed thereon. Modular semiconductor processing unit 80 may be as described in any of the various exemplary embodiments of modular semiconductor processing units. One or more of compartments 63 may include a modular semiconductor processing unit 80 which is a test monitor. After processing through a particular operation is complete, notches 67 allow for the individual modular semiconductor processing units to be removed from holder 61. It should be understood that the size and shape of compartments 63 is intended to be exemplary only and that, according to various alternative embodiments, compartments 63 may take on various other shapes and sizes to receive modular semiconductor processing units which may be sized and shaped differently, as described above.

Figure 8:
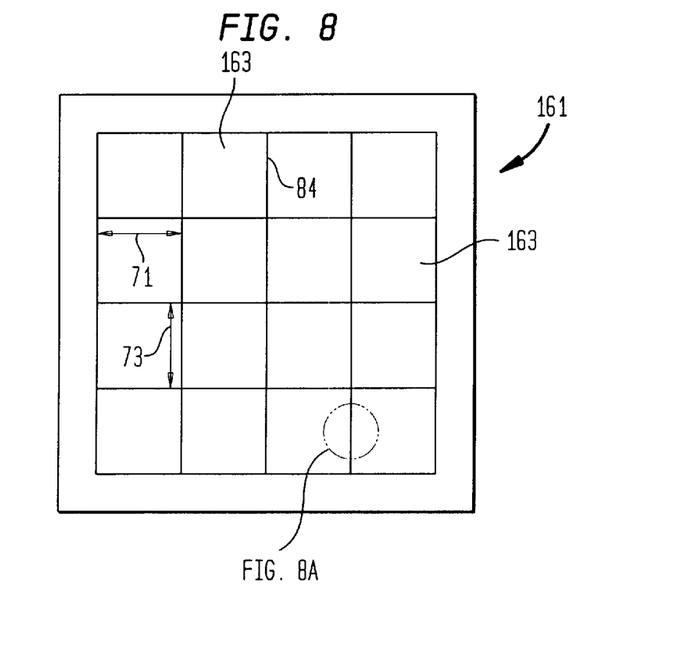
FIG. 8 is a plan view showing a second exemplary embodiment of a holder for holding multiple modular semiconductor processing units.

FIG. 8 shows a second exemplary embodiment of holder 161 having a substantially square shape. Holder 161 shown in FIG. 8 may be processed through various semiconductor processing tools and will include a modular semiconductor processing unit, within each compartment 163, each modular processing unit comprising a plurality of locations for fabrication of individual die. Each compartment 163 includes dimensions—length 73 and width 71, capable of releasably securing an individual modular semiconductor processing unit. Some or all of the raised ribs 84 which are shown more clearly in the expanded perspective view shown in FIG. 8A, may include groove 86 for accepting an outward projection such as a rib which may extend outward from the sides of the individual modular semiconductor processing units. The shape and dimensions of individual compartment 163 of holder 161 will vary depending on the size and shape of the modular semiconductor processing unit to be received within the compartment. The overall size and shape of holder 161 will be as determined by the processing tool within which holder 161 will be processed. It can be seen that, in the exemplary embodiment shown in FIG. 8, sixteen individual modular semiconductor processing units may be grouped together to form a single, cohesive processing unit capable of being simultaneously processed through any of various semiconductor processing tools which may be adapted to receive and process holder 161.

Figures 8A, 9:
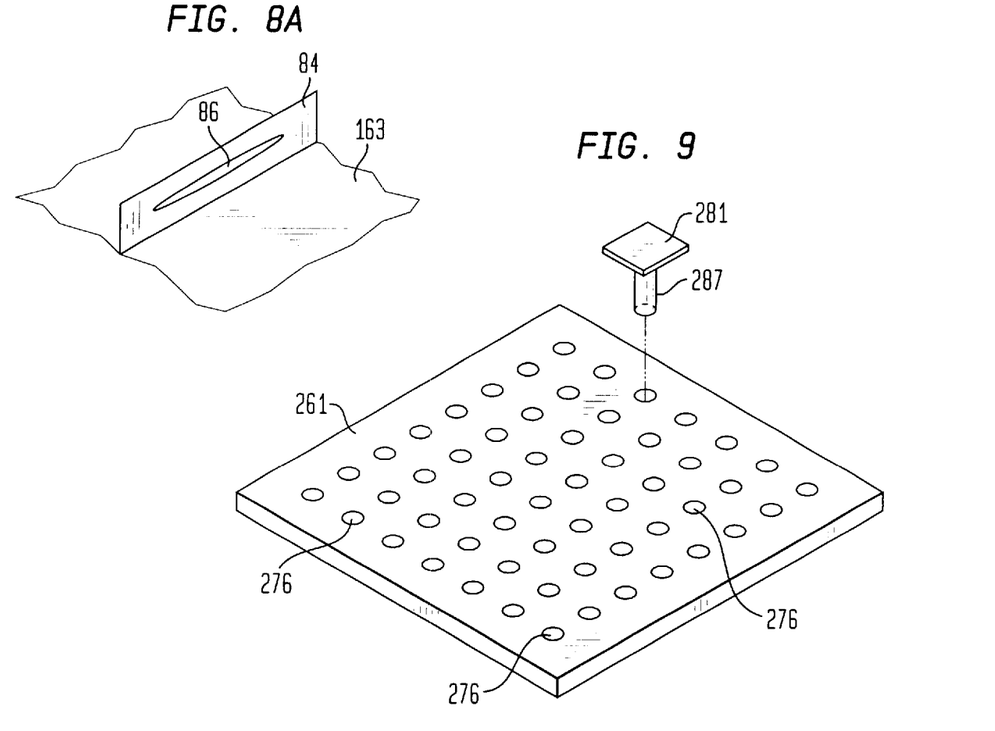
FIG. 8A is an expanded perspective view showing the ribs of the holder shown in FIG. 8.
FIG. 9 is a perspective view showing a third exemplary embodiment of a holder and a corresponding modular semiconductor processing unit.

FIG. 9 is a perspective view which shows a third exemplary embodiment of holder 261 which is substantially square in shape. Holder 261 includes a plurality of openings 276, each adapted to receive a corresponding post 287 which serves as a handling/positioning feature of modular semiconductor processing unit 281. In this manner, a number of modular semiconductor processing units 281 may be attached to holder 261, thereby grouped together to form a cohesive processing unit which may be processed unitarily through various semiconductor processing tools adapted to receive and process the holder 261 containing the cohesive processing unit. In this manner, a group of modular semiconductor processing units 281 are processed simultaneously to fabricate a number of die in proportion to the number of modular semiconductor processing units 281.

Figure 10:
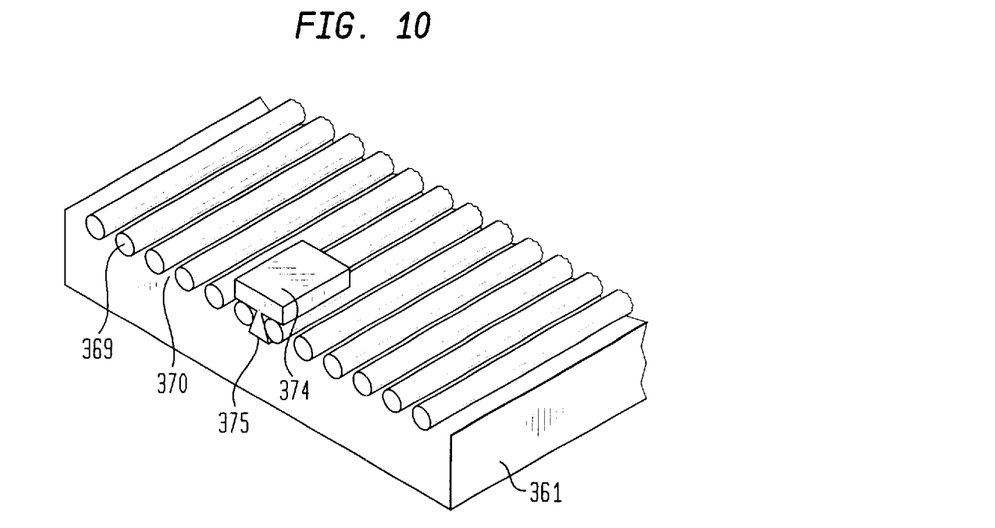
FIG. 10 is a perspective view showing a fourth exemplary embodiment of a holder, and a corresponding modular semiconductor processing unit.

FIG. 10 is a perspective view which shows a fourth exemplary embodiment of holder 361 which includes a series of parallel rods 369. Spaces 370 between adjacent rods 369 are each capable of receiving a dovetail rib 375 of a corresponding modular semiconductor processing unit 374. In this manner, a group of modular semiconductor processing units 374 may be arranged together to form a cohesive processing unit, and the modular semiconductor processing units 374 may be simultaneously processed through any of various semiconductor processing tools adapted to receive and process the holder 361 containing the cohesive processing unit.

Figure 11:
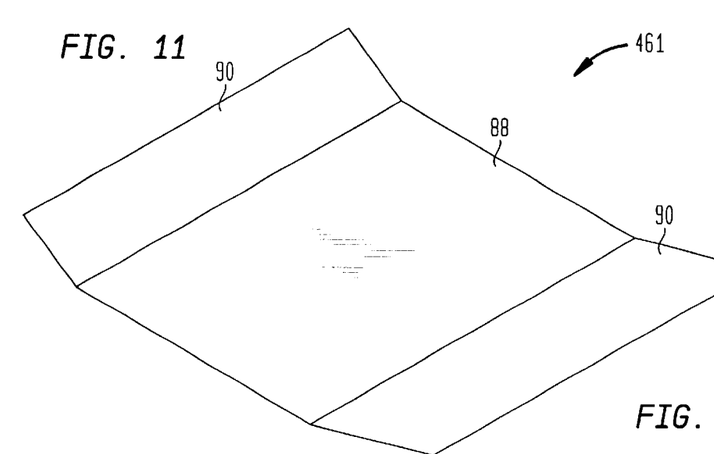
FIG. 11 is a perspective view showing a fifth exemplary embodiment of a holder for holding multiple individual modular semiconductor processing units.

The holders within which a group modular semiconductor processing units are arranged and retained, may take on various shapes such as the three dimensional shape shown in FIG. 11. FIG. 11 shows a fifth exemplary embodiment of a holder 461, having a substantially planar section 88 bounded by sides 90 which extend upward and therefore produce three dimensional holder 461. Holder 461 will include a multiplicity of individual compartments, not shown in FIG. 11, each of which may be sized and shaped to receive a corresponding modular semiconductor processing unit.

Figure 12:
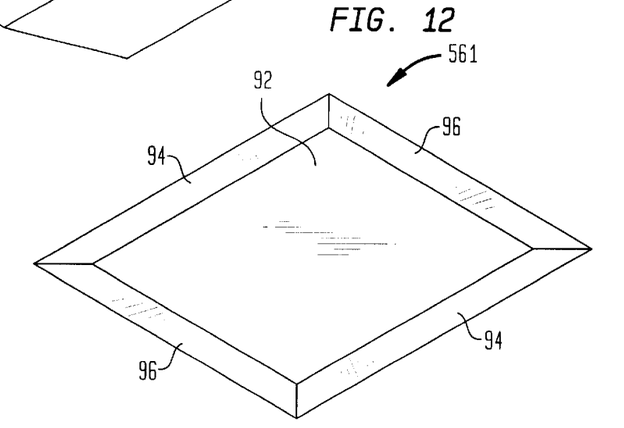
FIG. 12 is a perspective view showing a sixth exemplary embodiment of a holder for holding multiple modular semiconductor processing units.

FIG. 12 shows a sixth exemplary embodiment of holder 561 which is also a three-dimensional configuration. Substantially planar section 92 is bounded by sides 94 which extend upward and upper and lower sections 96 which also extend upward. The three-dimensional embodiments shown in FIGS. 11 and 12 may be preferred in semiconductor tools which are specifically adapted to load and process such holders, or they may be used in tools such as furnaces and wet benches which may not utilize automated handling and loading methods. Although individual compartments are not shown in FIGS. 11 and 12, it is understood that each holder includes a multiplicity of compartments, each capable of releasably securing a corresponding modular semiconductor processing unit.

Figure 13:
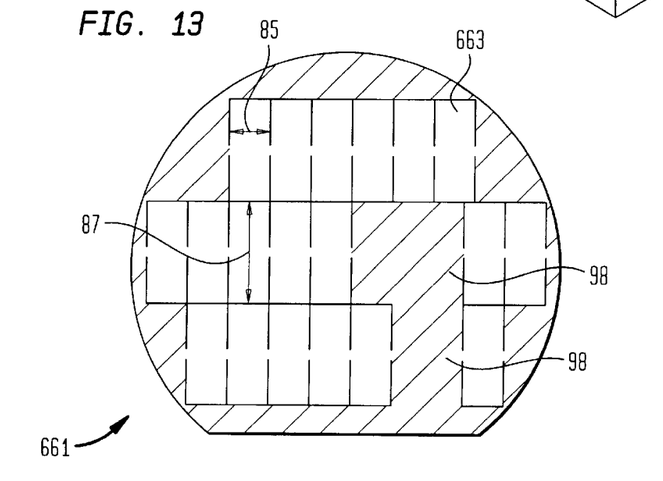
FIG. 13 is a plan view showing a seventh exemplary embodiment of a holder for holding multiple modular semiconductor processing units.

FIG. 13 shows a seventh exemplary embodiment of a holder 661 which contains a number of compartments 663 sized and shaped to receive a substantially rectangular modular semiconductor processing unit. Each compartment 663 includes height 87 and width 85. It is also pointed out that holder 661 may include unused regions 98 in which compartments do not appear. This may be to account for limitations in the uniformity of the processing tool being used.

The various embodiments of holders, as described above, may be processed individually or simultaneously through the various semiconductor processing tools listed above. Furthermore, the various features such as the slots shown in FIG. 8A, and the openings shown in FIGS. 9 and 10, or other locking features such as a spring loaded locking system, may be used to secure the individual modular processing units in place.

It should be understood that, in various exemplary embodiments, a holder may not be needed. Rather, a multiplicity of individual modular semiconductor processing units may be processed together as a cohesive processing unit, through various processing tools which may be configured to receive and process the cohesive processing unit, without the requirement of a holder.

It should be emphasized, at this point, that the exemplary embodiments of the modular semiconductor processing units, the handling/positioning features, and the holders shown and described above, are not intended to be restrictive of the present invention. Rather, various other embodiments may be used for each.

The present invention also provides a method for forming semiconductor devices using this modular-based processing scheme. As discussed above, the individual modular semiconductor processing units may be of various shapes and sizes. Furthermore, they may be formed of a single thick semiconductor substrate or a thinner semiconductor substrate mounted upon a base substrate. They may include various numbers of individual die and they may additionally include alignment and handling features.

In all cases, the modular processing units may be individually processed through various semiconductor processing tools while they additionally may be processed together as a group forming a cohesive processing unit, in various of other semiconductor processing tools. For example, in a first operation, the modular semiconductor processing units may be processed individually through the processing operation, and in a second processing operation they may be arranged together to form a first cohesive processing unit which is processed unitarily through the second processing operation. In an alternative embodiment, the opposite processing sequence may be used.

After the second processing operation, the modular semiconductor processing units may be processed individually or grouped together to form a second cohesive processing unit through the third processing operation. The first and second cohesive processing units may be of the same size and shape, or they may differ depending on the processing operation and processing tools used to perform the operations. Each of the cohesive processing units may be formed and secured by any of the exemplary embodiments of holders previously discussed. This is intended to be exemplary only and it can be seen that depending on the processing operation and the semiconductor processing tool used to perform the operation, the modular processing units may be processed either as a cohesive processing unit formed of a group of modular processing units arranged together, or they may be processed individually. According to an exemplary embodiment wherein the modular processing units are processed together as a cohesive processing unit, a holder may not be needed.

According to the embodiment wherein the modular semiconductor processing units are grouped together to form a cohesive processing unit, the cohesive processing units may be processed individually within a processing tool or a group of cohesive processing units may be processed simultaneously through a tool, depending on the tool and the operation being performed.

According to one exemplary embodiment, a cohesive processing unit may include a number of modular semiconductor processing units arranged together along a plane to form a fixed, two-dimensional array. According to another exemplary embodiment, the cohesive processing unit may include the modular semiconductor processing units arranged in a three-dimensional configuration.

In the preferred embodiment, a test monitor may be processed through several or each of the processing operations together with the modular semiconductor processing units upon which active semiconductor devices are being formed. The test monitor may be processed individually through processing operations in which the modular processing units are processed individually or sequentially, or the test monitor may be included within the cohesive processing unit formed of a number of modular semiconductor processing units arranged together to form a group. According to an alternative embodiment, test structures may be included within an active device.

In any case, it can be seen that, after processing the test monitor through a particular processing operation together with active devices, the test monitor may be removed without delaying the subsequent processing of the other modular semiconductor processing units. According to the embodiment wherein test structures are included within active devices, a single modular semiconductor processing unit may be removed after the identified processing operation. It can be seen that only the individual test monitor or a single modular semiconductor processing unit must be removed for analysis. In this manner, few or none of the potentially good active devices must be sacrificed simply in order to test the test monitor or test structure.

According to another exemplary embodiment, parametric or other testing may be done on each of the modular semiconductor processing units after they all have been processed through a particular processing operation. Modular semiconductor processing units which include a majority of structures which fail, can be removed from the group and need not be processed further. In this manner, the procedure of processing a large wafer containing hundreds of semiconductor devices, in the hope that a few potentially good die yield, may be avoided.

Generally speaking, for each particular processing operation, each of the modular semiconductor processing units will be processed through the processing operation, either individually, sequentially or grouped together to form a cohesive processing unit or a number of cohesive processing units, before they are further processed at a subsequent processing operation in the same manner. The processing tool which performs the processing operation may be adapted to accommodate more than one cohesive processing unit being processed simultaneously or it may process each of the cohesive processing units separately. In this manner, a number of modular semiconductor processing units may be provided, then processed as groups, each forming a cohesive processing unit, until all of the modular semiconductor processing units are processed through the particular operation. The same procedure may again be carried out at subsequent processing operations.

According to the embodiment whereby each of the modular semiconductor processing units are tested after a particular operation, defective ones may be removed prior to the next processing operation, reducing the total number of modular semiconductor processing units to be processed at the next processing operation.

The present invention is directed most generally to forming semiconductor devices using a modular substrate-based manufacturing model. The present invention is not intended to be limited to the various examples of modular semiconductor processing units shown and described. Rather, any of various modular semiconductor processing units may be used which include a limited number of die. The modular processing units may be processed individually, sequentially, or grouped together as cohesive processing unit through various semiconductor processing tools. The cohesive processing units may take on various configurations and may be processed individually or simultaneously through various processing operations, depending on the tool used to perform the operations. The modular processing units may be sized and shaped in conjunction with the processing tools or the holders used for group processing as a cohesive processing unit. The converse may also be true. The individual modular semiconductor processing units need not be formed from a single crystal silicon ingot of substantial width.

The modular based manufacturing model provides the following advantages:

Reduced cost of semiconductor substrates. Smaller pieces of silicon which form the modular semiconductor processing units are much less expensive to produce than are 8" and 12" ingots.

Reduced scrap of good chips. Only those modular semiconductor processing units which have chips with killer defects would be scrapped; not an entire wafer including tens or hundreds of good devices.

No need to destroy entire wafers for process monitoring.

Circular substrate shape is not required.

Eliminates the need to do analytical work in the manufacturing line. All analysis could be done "off line" since only a minimal number of potentially good chips must be sacrificed.

More space available for manufacturing by the removal of analytical equipment from the controlled-environment manufacturing area. No need to include critical dimension monitoring tools such as scanning electron microscopes or defect review tools in the manufacturing area.

Lower costs and longer longevity for process tools.

Lowers the costs of updating a clean room and decreases the costs of building a new clean room manufacturing facility.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A cohesive processing unit comprising a plurality of modular semiconductor substrate units arranged together along a plane, each modular semiconductor substrate unit including at least one semiconductor device being formed thereon and said cohesive processing unit capable of being unitarily processed within semiconductor processing equipment.

2. The cohesive processing unit as in claim 1, wherein said plurality of modular semiconductor substrate units are adapted to be further arranged to form a further cohesive processing unit further adapted to be processed within said semiconductor processing equipment.

3. The cohesive processing unit as in claim 1, wherein each of said plurality of modular semiconductor substrate units is essentially the same shape and size.

4. The cohesive processing unit as in claim 1, further comprising a holder for retaining said cohesive processing unit during processing within said semiconductor processing equipment, said holder including a corresponding plurality of compartments, each adapted to releasably secure a modular semiconductor substrate unit of said plurality of modular semiconductor substrate units.

5. The cohesive processing unit as in claim 4, wherein each of said plurality of modular semiconductor substrate units includes a rib extending from a bottom surface thereof and each compartment includes an opening for receiving said rib of a corresponding modular semiconductor substrate unit.

6. The cohesive processing unit as in claim 4, wherein each of said plurality of modular semiconductor substrate units includes a post extending from a bottom surface thereof and each compartment includes an opening for receiving said post of a corresponding modular semiconductor substrate unit.

7. The cohesive processing unit as in claim 4, wherein each of said plurality of modular semiconductor substrate units includes a groove therein for securing each modular semiconductor substrate unit to a compartment of said corresponding plurality of compartments.

8. A modular processing unit for forming semiconductor devices within semiconductor processing equipment, said modular processing unit comprising a semiconductor substrate mounted on a base substrate, said semiconductor substrate adapted for having at least one semiconductor device formed on an upper surface thereof and said modular processing unit adapted for being individually processed through semiconductor processing equipment.

9. The modular processing unit as in claim 8, wherein said modular processing unit includes a diameter being less than three inches.

10. The modular processing unit as in claim 8, wherein said base substrate is formed of one of glass, ceramic and teflon.

11. The modular processing unit as in claim 8, wherein said base substrate is formed of silicon.

12. The modular processing unit as in claim 8, further comprising an adhesive securing said semiconductor substrate to said base substrate.

13. The modular processing unit as in claim 8, wherein said at least one semiconductor device includes device features having lateral dimensions being 0.2 microns or less.

14. The modular processing unit as in claim 8, wherein said semiconductor processing equipment includes etch reactors, chemical mechanical polishing tools, sputter deposition reactors, chemical vapor deposition reactors, plasma vapor deposition reactors, coating equipment,. evaporation tools, ion implantation tools, diffusion furnaces, cleaning equipment and patterning equipment.

15. The modular processing unit as in claim 8, wherein said modular processing unit is essentially circular in shape.

16. The modular processing unit as in claim 8, wherein said modular processing unit is substantially square in shape.

17. The modular processing unit as in claim 8, wherein said modular processing unit comprises a parallelogram.

18. The modular processing unit as in claim 8, wherein said semiconductor substrate comprises silicon.

19. The modular processing unit as in claim 8, further comprising a groove formed in at least one of a side or a bottom surface of said base substrate.

20. The modular processing unit as in claim 8, further including a rib extending from a bottom surface of said base substrate.

21. The modular processing unit as in claim 8, further including a post extending from a bottom surface of said base substrate.

22. The modular processing unit as in claim 8, wherein said modular processing unit is capable of being arranged together with other of said modular processing units to form a cohesive processing unit which is capable of being unitarily processed through said semiconductor processing equipment.

23. An apparatus comprising a plurality of modular processing units as in claim 8, arranged together to form a cohesive processing unit adapted to be unitarily processed within said semiconductor processing equipment.

24. The apparatus as in claim 23, wherein said cohesive processing unit includes said plurality of modular processing units being arranged within a three-dimensional configuration.

25. A semiconductor substrate adapted for having at least one semiconductor device formed on an upper surface thereof, capable of being individually processed through semiconductor processing equipment, further capable of being arranged together with other said semiconductor substrates to form a cohesive processing unit capable of being unitarily processed through said semiconductor processing equipment, and including one of a groove formed within one of a bottom surface and a side thereof, a post extending from a bottom surface thereof and a rib extending from a bottom surface thereof.

26. The semiconductor substrate as in claim 25, wherein said semiconductor substrate includes a diameter of less than three inches.

27. A modular processing unit for forming semiconductor devices within semiconductor processing equipment, said modular processing unit comprising a semiconductor substrate having a thickness of at least 700 $\mu$m, said modular processing unit including one of a rib, a post and a groove formed on one of a bottom surface and a side of said semiconductor substrate, and adapted for having at least one semiconductor device formed thereon, having a diameter being less than three inches and adapted for being individually processed through semiconductor processing equipment.

* * * * *